(12) United States Patent
Pun et al.

(10) Patent No.: US 11,594,509 B2
(45) Date of Patent: Feb. 28, 2023

(54) FABRICATION PROCESS AND STRUCTURE OF FINE PITCH TRACES FOR A SOLID STATE DIFFUSION BOND ON FLIP CHIP INTERCONNECT

(71) Applicant: Compass Technology Company Limited, Shatin (HK)

(72) Inventors: Kelvin Po Leung Pun, Hong Kong (HK); Chee Wah Cheung, Hong Kong (HK)

(73) Assignee: Compass Technology Company Limited, Shatin (HK)

( * ) Notice: Subject to any disclaimer, the term of this patent is extended or adjusted under 35 U.S.C. 154(b) by 129 days.

(21) Appl. No.: 17/164,217

(22) Filed: Feb. 1, 2021

(65) Prior Publication Data

US 2021/0159203 A1    May 27, 2021

Related U.S. Application Data

(60) Division of application No. 16/157,494, filed on Oct. 11, 2018, now Pat. No. 10,923,449, which is a
(Continued)

(51) Int. Cl.
*H01L 23/00* (2006.01)
*H01L 23/498* (2006.01)

(52) U.S. Cl.
CPC .......... *H01L 24/29* (2013.01); *H01L 23/4985* (2013.01); *H01L 24/03* (2013.01);
(Continued)

(58) Field of Classification Search
CPC ............ H01L 24/81; H01L 2224/1134; H01L 23/49838; H01L 2224/8182
See application file for complete search history.

(56) References Cited

U.S. PATENT DOCUMENTS 6,784,554 B2    8/2004   Kajiwara et al.
7,878,385 B2    2/2011   Kumar et al.
(Continued)

FOREIGN PATENT DOCUMENTS

CN    101325188 A    12/2008
JP    2003-197673     7/2003
(Continued)

OTHER PUBLICATIONS

Japanese Office Action, Reference No. CP18-001, Patent Application No. 2018-521584, dated Aug. 17, 2021, 3 pages.
(Continued)

*Primary Examiner* — Dale E Page
*Assistant Examiner* — Wilner Jean Baptiste
(74) *Attorney, Agent, or Firm* — Saile Ackerman LLC; Stephen B. Ackerman; Rosemary L. S. Pike

(57) ABSTRACT

A method to produce a semiconductor package or system-on-flex package comprising bonding structures for connecting IC/chips to fine pitch circuitry using a solid state diffusion bonding is disclosed. A plurality of traces is formed on a substrate, each respective trace comprising five different conductive materials having different melting points and plastic deformation properties, which are optimized for both diffusion bonding of chips and soldering of passives components.

20 Claims, 11 Drawing Sheets

Related U.S. Application Data continuation-in-part of application No. 15/286,849, filed on Oct. 6, 2016, now Pat. No. 10,103,095.

(52) U.S. Cl.
CPC ........ *H01L 24/05* (2013.01); *H01L 23/49811* (2013.01); *H01L 23/49838* (2013.01); *H01L 24/13* (2013.01); *H01L 24/16* (2013.01); *H01L 24/45* (2013.01); *H01L 24/48* (2013.01); *H01L 24/81* (2013.01); *H01L 2224/1134* (2013.01); *H01L 2224/1146* (2013.01); *H01L 2224/13101* (2013.01); *H01L 2224/13144* (2013.01); *H01L 2224/1601* (2013.01); *H01L 2224/16225* (2013.01); *H01L 2224/32225* (2013.01); *H01L 2224/45144* (2013.01); *H01L 2224/48227* (2013.01); *H01L 2224/73204* (2013.01); *H01L 2224/81048* (2013.01); *H01L 2224/8182* (2013.01); *H01L 2224/8183* (2013.01); *H01L 2224/81191* (2013.01); *H01L 2224/81203* (2013.01); *H01L 2224/81444* (2013.01); *H01L 2224/81801* (2013.01); *H01L 2224/83444* (2013.01); *H01L 2224/85444* (2013.01); *H01L 2224/92125* (2013.01); *H01L 2924/01079* (2013.01); *H01L 2924/19105* (2013.01)

(56) References Cited

U.S. PATENT DOCUMENTS

| | | | |
|---|---|---|---|
| 8,115,316 | B2 | 2/2012 | Kohara et al. |
| 8,178,964 | B2 | 5/2012 | Yang |
| 8,440,506 | B2 | 5/2013 | Roberts et al. |
| 8,940,581 | B2 | 1/2015 | Lee et al. |
| 8,967,452 | B2 | 3/2015 | Cheung et al. |
| 9,153,551 | B2 | 10/2015 | Liang |
| 10,103,095 | B2 | 10/2018 | Pun et al. |
| 10,665,535 | B2 * | 5/2020 | Lee ............... H01L 21/4853 |
| 10,896,271 | B1 * | 1/2021 | Baudart ............... H02K 3/42 |
| 10,923,449 | B2 | 2/2021 | Pun et al. |
| 2001/0042923 | A1 | 11/2001 | Yanagida |
| 2003/0127747 | A1 | 7/2003 | Kajiwara et al. |
| 2004/0101993 | A1 | 5/2004 | Salmon |
| 2005/0266670 | A1 | 12/2005 | Lin et al. |
| 2006/0249857 | A1 | 11/2006 | Haba et al. |
| 2007/0080444 | A1 | 4/2007 | Kurita |
| 2008/0061437 | A1 | 3/2008 | Kohara et al. |
| 2009/0211786 | A1 | 8/2009 | Bamba et al. |
| 2009/0291554 | A1 | 11/2009 | Lin et al. |
| 2014/0110847 | A1 | 4/2014 | Tseng et al. |

FOREIGN PATENT DOCUMENTS

| | | |
|---|---|---|
| JP | 2003 197673 A | 7/2003 |
| JP | 2007-109982 | 4/2007 |
| JP | 2007 109982 A | 4/2007 |
| JP | 2007-262563 | 10/2007 |
| JP | 2007 262563 A | 10/2007 |
| JP | 2008-85308 | 4/2008 |
| JP | 2008 85308 A | 4/2008 |
| TW | 200723416 | 5/1995 |
| TW | 200814212 | 9/1996 |

OTHER PUBLICATIONS

U.S. Notice of Allowance, U.S. Appl. No. 15/286,849, Applicant: Pun et al., dated May 23, 2018, 10 pages.
U.S. Office Action, U.S. Appl. No. 15/286,849, Applicant: Pun et al., dated Feb. 14, 2018, 10 pages.
U.S. Office Action, U.S. Appl. No. 15/286,849, Applicant: Pun et al., dated Sep. 7, 2017, 9 pages.
U.S. Office Action, U.S. Appl. No. 16/157,494, Applicant: Pun et al., dated Jun. 25, 2020, 13 pages.
U.S. Notice of Allowance, U.S. Appl. No. 16/157,494, Applicant: Pun et al., dated Oct. 19, 2020, 7 pages.
Korean Office Action, Application No. 10-2018-7036318, Applicant: Compass Technology Company Limited, dated Jan. 11, 2022, 7 pages.
Translation of Korean Office Action, Application No. 10-2018-7036318, Applicant: Compass Technology Company Limited, dated Jan. 11, 2022, 8 pages.
Korean Notice of Allowance, Application No. 10-2018-7036318, Applicant: Compass Technology Company Limited, dated Oct. 21, 2022, 2 pages.
Chinese Office Action, Application No. 201780061589.8, Applicant: Compass Technology Company Limited, dated Nov. 23, 2022, 5 pages.

* cited by examiner

FABRICATION PROCESS AND STRUCTURE OF FINE PITCH TRACES FOR A SOLID STATE DIFFUSION BOND ON FLIP CHIP INTERCONNECT

This application is a divisional of Ser. No. 16/157,494, filed on Oct. 11, 2018, which is a Continuation-In-Part of Ser. No. 15/286,849, filed on Oct. 6, 2016, issued as U.S. Pat. No. 10,103,095 on Oct. 16, 2018, all owned by a common assignee and herein incorporated by reference in their entirety.

TECHNICAL FIELD

This application relates to producing a semiconductor package, and more particularly, to producing a semiconductor package with solid state diffusion bonding.

BACKGROUND

High density interconnect (HDI) substrates are growing in market demand, driven by the increase in number of I/O ports and decrease in the size of devices with increased functionality and higher speeds. Tape substrates have several typical advantages over rigid substrates, including:
1) Finer line width/space with higher circuit density
2) Thin in profile and light in weight
3) Better thermal performance With the number of I/O ports constantly increasing, flip chip is a key technology which provides benefits such as high I/O, finer pitch interconnection, and superior electrical and thermal performance, which drive its applications across specific segments. There is a continuous demand for fine pitch interconnection including display drivers, CMOS image sensors, baseband processors, power management units, and so on.

Low-cost and high reliability interconnection processes will play a key role in the development of advanced packaging for the next century. Diffusion bonding is a method of joining metallic or non-metallic materials. This bonding technique is based on the atomic diffusion of elements at the joining interface. In the technology of diffusion bonding to connect IC/Chip to the substrate, a combination of heat and pressure is applied across a contact interface having as one portion a deformable layer so that under pressure the plastic deformation of that layer operates to bring the interface to the bonding temperature more quickly and to enhance diffusion. The result is that strong and reliable bonds are formed. However, when the bond pitch is reduced to where the contact is 10 µm wide and the spacing between contacts is 10 µm (microns) or below, a number of independent aspects require consideration. Copper, as conductor, is usually preferred due to its excellent electrical and thermal conductivity. The deformable layer must provide the requisite electrical properties. The deformable layer must deform at an essentially uniform pressure from contact to contact and there must be enough top width on the bonding surface of the trace so that a full contact interface and a proper surface on the deformable layer is formed. As the bond pitch becomes tighter and tighter, the traditional semi-additive and subtractive methods have limitations for reducing the trace pitch to below 20 µm based on the current reel to reel manufacturing capabilities; specifically, it is difficult to maintain the top and bottom trace ratio as 1. In general, the diffusion rate, in term of diffusion coefficient D, is defined as $D=D_o \exp(-Q/RT)$, where $D_o$ is the frequency factor depending on the type of lattice and the oscillation frequency of the diffusing atom, Q is the activation energy, R is the gas constant and T is the temperature in Kelvin.

Diffusion of atoms is a thermodynamic process where temperature and diffusibility of the material are critical parameters. Creep mechanism allows a material flow to produce full intimate contact at the joint interface as required for diffusion bonding. Therefore, the surface finish of the trace and the selection of bonding temperature and loading are important factors in the diffusion bonding process. Other factors such as plastic deformation, thermal conductivity, thermal expansion, and bonding environment also effect the bonding process, particularly at high bonding temperatures.

Thermo-compression bonding has a predicted application in flip chip assembly using gold bumps. The bumps are made on substrates using stud bumping methods or electrolytic gold plating. During the process of bonding, the chip is picked up and aligned face down to bumps on a heated substrate. When the bonding component presses down, the gold bumps deform and make intense contact with the pads of bonding causing pure metal to metal welding to take place. Thermal compression bonding needs a flip chip bonder that is capable of generating a greater bonding temperature of 300° Celsius with a force of around 100N/bump and a greater extent of parallelism between substrate and chip. For greater yield bonding, the temperature and bonding force are required to be well-controlled. In order to avoid damaging the semiconductor material, the bonding force must be graduated. Excessive bonding force may cause cracks in the passivation of the chip and sometimes bridging of the bumps in a fine pitch array due to over-deformation of the bumps. The selection of surface finish on the trace is critical to improve the diffusion bonding process.

U.S. Pat. No. 8,940,581 (Lee et al), U.S. Pat. No. 8,967,452 (Cheung et al), U.S. Pat. No. 8,440,506 (Roberts et al), U.S. Pat. No. 9,153,551 (Liang et al), and U.S. Pat. No. 7,878,385 (Kumar et al) disclose thermal compression processes.

SUMMARY

A principal object of the present disclosure is to provide a thermo-compression bonding method for a semiconductor package.

Another object of the disclosure is to provide an improved surface for thermo-compressive bonding for a semiconductor package.

According to the objects of the disclosure, a semiconductor package is provided comprising a flexible substrate and a plurality of traces formed on the flexible substrate. Each trace comprises at least five different conductive materials having different melting points and plastic deformation properties, which are optimized for both diffusion bonding and soldering of passive components. At least one die is mounted on the substrate through diffusion bonding with at least one of the plurality of traces.

Also according to the objects of the disclosure, a method of manufacturing a substrate for diffusion bonding is achieved. A substrate is provided A plurality of traces is formed on the substrate using the following steps. Copper traces are electrolytically plated on the substrate having a pitch of between about 10 µm and 30 µm. Next, nickel-phosphorus is electrolessly plated on top and side surfaces of the copper traces. Palladium is electrolessly plated on the nickel-phosphorus layer, and gold is immersion plated on the palladium layer. The completed traces are suitable for thermo-compressive bonding to a die having a gold bump thereon. The completed traces are also suitable for surface mounting to solder bumps.

Also according to the objects of the disclosure, a method of manufacturing a semiconductor package is achieved. A plurality of traces is formed on a substrate according to the following steps. A Ni—P seed layer is electrolessly plated on a substrate. Copper traces are electrolytically plated on a the Ni—P seed layer having a pitch of between about 10 μm and 30 μm with a line width of about 7.5 μm and spacing of about 7.5 μm. A nickel-phosphorus layer is electrolessly plated on top and side surfaces of the plurality of copper traces. A palladium layer is electrolessly plated on the nickel-phosphorus layer and a gold layer is immersion plated on the palladium layer A gold bump is formed on a die surface. The die is diffusion bonded to at least one of the plurality of copper traces by thermal compression of the gold bump to complete the semiconductor package.

Also according to the objects of the disclosure, a method of manufacturing a substrate for diffusion bonding is achieved. A substrate is provided. A plurality of traces is formed on the substrate using the following steps. Copper traces are electrolytically plated on the substrate having a pitch of between about 10 μm and 30 μm. Next, a first gold layer is immersion plated on top and side surfaces of the copper traces. Palladium is electrolessly plated on the nickel-phosphorus layer, and a second gold layer is immersion plated on the palladium layer. The completed traces are suitable for thermo-compresssive bonding to a die having a gold bump thereon. The completed traces are also suitable for surface mounting to solder bumps.

Also according to the objects of the disclosure, a method of manufacturing a semiconductor package is achieved. A plurality of traces is formed on a substrate according to the following steps. A Ni—P seed layer is electrolessly plated on a substrate. Copper traces are electrolytically plated on a the Ni—P seed layer having a pitch of between about 10 μm and 30 μm with a line width of about 7.5 μm and spacing of about 7.5 μm. A first gold layer is immersion plated on top and side surfaces of the plurality of copper traces. A palladium layer is electrolessly plated on the nickel-phosphorus layer and a second gold layer is immersion plated on the palladium layer. A gold bump is formed on a die surface. The die is diffusion bonded to at least one of the plurality of copper traces by thermal compression of the gold bump to complete the semiconductor package.

BRIEF DESCRIPTION OF THE DRAWINGS

In the accompanying drawings forming a material part of this description, there is shown.

DESCRIPTION OF THE PREFERRED EMBODIMENTS

The present disclosure provides a method for forming a semiconductor package using solid state diffusion, or thermo-compressive bonding. Electroless Nickel/Electroless Palladium/Immersion Gold (ENEPIG) with ultra-thin Ni—P deposition or Immersion Gold/Electroless Palladium/ Immersion Gold (IGEPIG) serve as potential replacements of the traditional electrolytic surface finish because of their superior electrical performance in flip chip, copper pillar, and solder joint interconnection in prior arts. The present disclosure provides a variation of the ENEPIG or IGEPIG process that provides a superior bonding structure for solid state diffusion bonding.

The present disclosure provides a method for producing a semiconductor package or system-on-flex package where the semiconductor package consists of bonding structures for connecting IC/chips to a fine pitch circuitry which are heated and pressed into a solid state diffusion bonding relation. A substrate is mounted to a die using a flip chip method. The bonding structures are formed by a plurality of traces on the substrate, each respective trace comprising five different conductive materials having different melting points and plastic deformation properties, which are optimized for both diffusion bonding of chips and soldering of passive components or package. A passive component can be mounted adjacent to the chip/ICs using surface mount technology. The traces are plated up using a full additive or semi-additive process. The process of the present disclosure is capable of reducing the bond pitch to below about 16 μm, with a trace aspect ratio of more than 1, using current reel to reel manufacturing capabilities. The methods are not limited to single metal layer substrates but can be applied to a wide range of applications, including multilayer flex substrates and foldable flex packages.

The disclosed method incorporating diffusion bonding on a trace is especially advantageous in fabricating devices including: a communications device, a fixed location data unit, a wearable electronic device, a display driver, a CMOS image sensor, a baseband processor, a power management unit, a memory, CPU, GPU, and ASIC, and for applications in mobile/wireless, consumer, computing, medical, industrial, and automotive technologies.

Figure 1A:
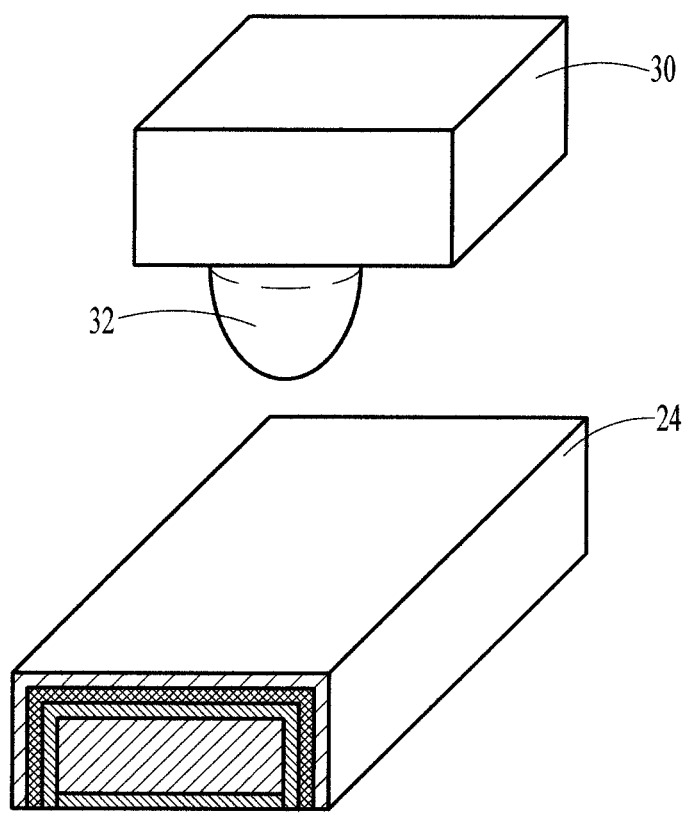
FIGS. 1A and 1B schematically illustrate in cross-sectional representation a thermo-compressive bonding method of the present disclosure.
Figure 1B:
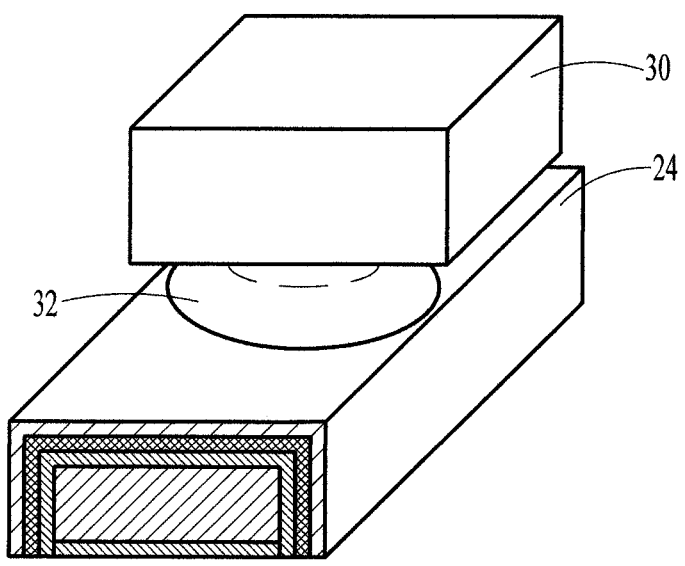

FIG. 1A illustrates an example of a system on flex or chip on flex package that includes a flip chip IC/chips to bond on a trace using a thermal compression bonding. Die 30 has a gold bump 32 on its underside. FIG. 1B illustrates the die 30 after thermal compression bonding to trace 24, showing compression of the gold bump 32. The trace comprises five different conductive materials having different melting points and plastic deformation properties which are optimized for high density circuit and thermal compression bonding to provide electrical connections. SEM pictures of a trace after thermal compression bonding to a gold plated bump show the diffusion bond to be solid.

Figure 2:
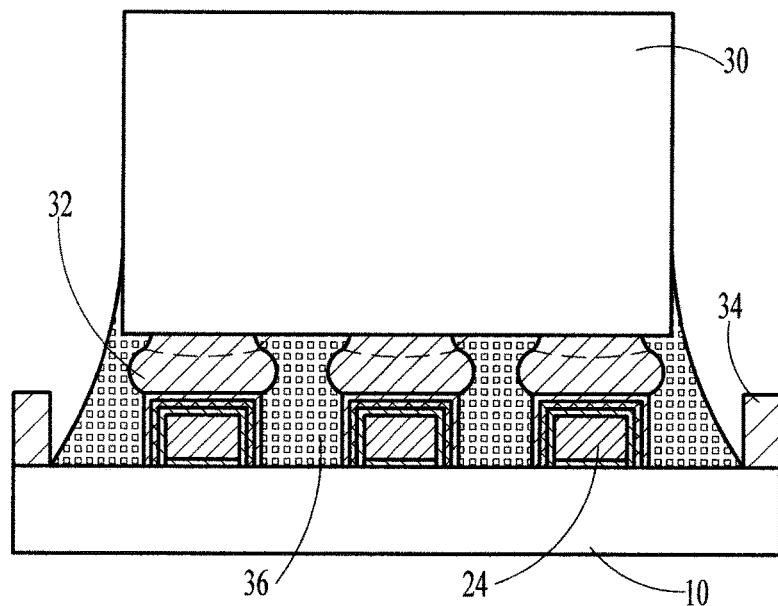
FIGS. 2-6 schematically illustrate in cross-sectional representation several preferred embodiments of the present disclosure.

FIG. 2 illustrates a system on flex package including a die/chip 30 that is bonded onto the substrate 10. There are several electrical connections 24 and underfill 36 between the chip 30 and the substrate 10. The capillary underfill is applied after thermal compression bonding to protect the electrical connections between the chip and the substrate and to compensate for differences in thermal expansion rates between the gold bump and the flex substrate to increase the life expectancy of the finished product. The underfill 36 is dispensed on one or more sides of the flip chip die, sometimes in multiple dispense passes to allow for capillary action. The trace comprises five different conductive materials having different melting points and plastic deformation properties which are optimized for high density circuit and thermal compression bonding to provide electrical connections.

Figure 3:
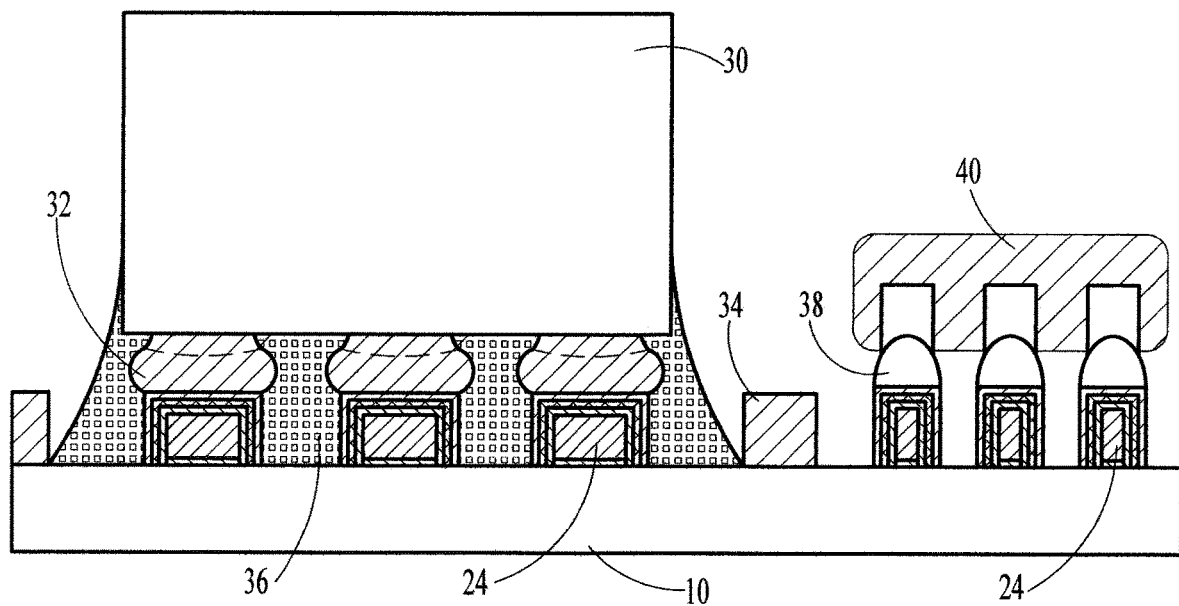

FIG. 3 illustrates an example of a system on flex package that includes at least one flip chip die 30 using a thermal compression bonding. Shown are gold bumps 32 with electrical connections 24 and capillary underfill 36 between the chip and the substrate 10. Passive components 40 are mounted adjacent to the Chip/IC using surface mount technology. The surface finish on the traces 24 is optimized to have both good diffusion bonding through gold bumps 32 and soldering capabilities through solder bumps 38.

Figure 4:
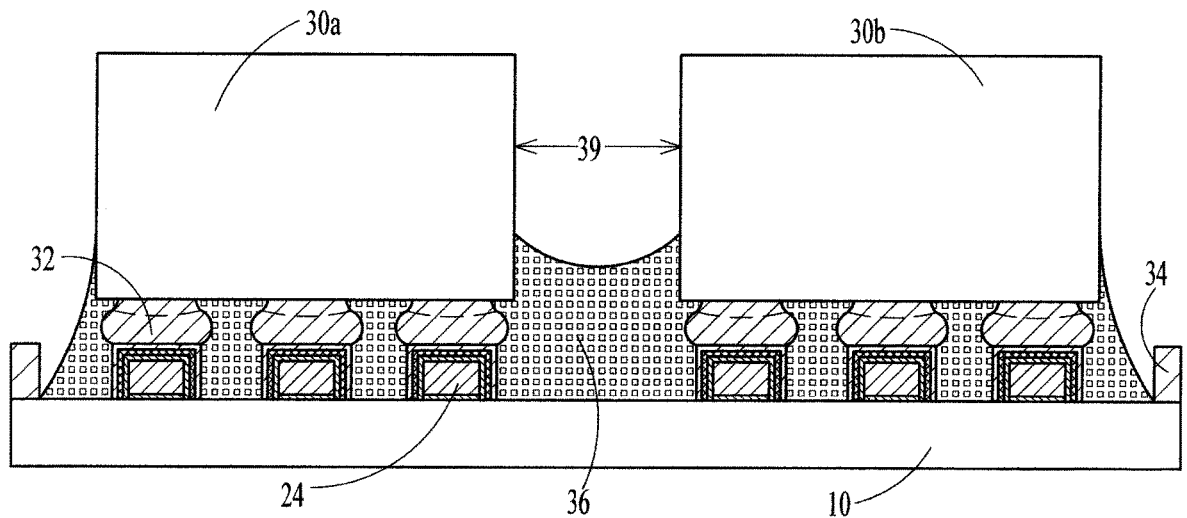

FIG. 4 illustrates a flip chip package in which two dies 30a and 30b are mounted onto traces 24 on the substrate 10 using thermal compression bonding through gold bumps 32. Any number of dies may be so mounted onto the substrate. As shown in FIG. 4, the minimum die to die gap 39 can be controlled at below about 10 µm spacing with the control flip chip bonding accuracy of +/−2 µm.

Figure 5:
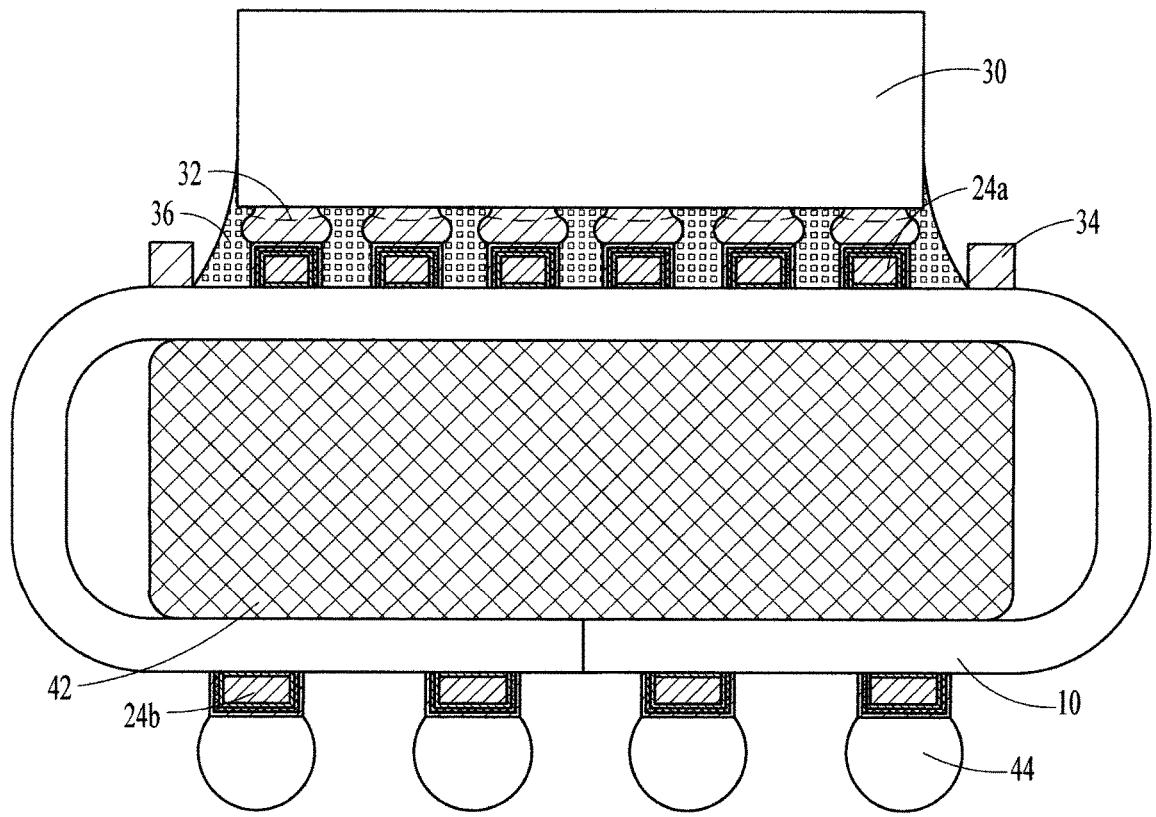

FIG. 5 illustrates an example of a chip/die assembled to a foldable flexible package using a thermal compression bonding process. At least one die 30 is mounted onto the substrate 10 using a thermal compression bonding process. The surface finish on the traces 24a is optimized to allow for thermal compression bonding through gold bumps 32 and also solder ball attach to traces 24b elsewhere on the substrate 10. Substrate 10 is folded around a stiffener 42 and solder balls 44 are attached to traces 24b on an underside of the substrate on a bottom surface of the stiffener 42.

Figure 6:
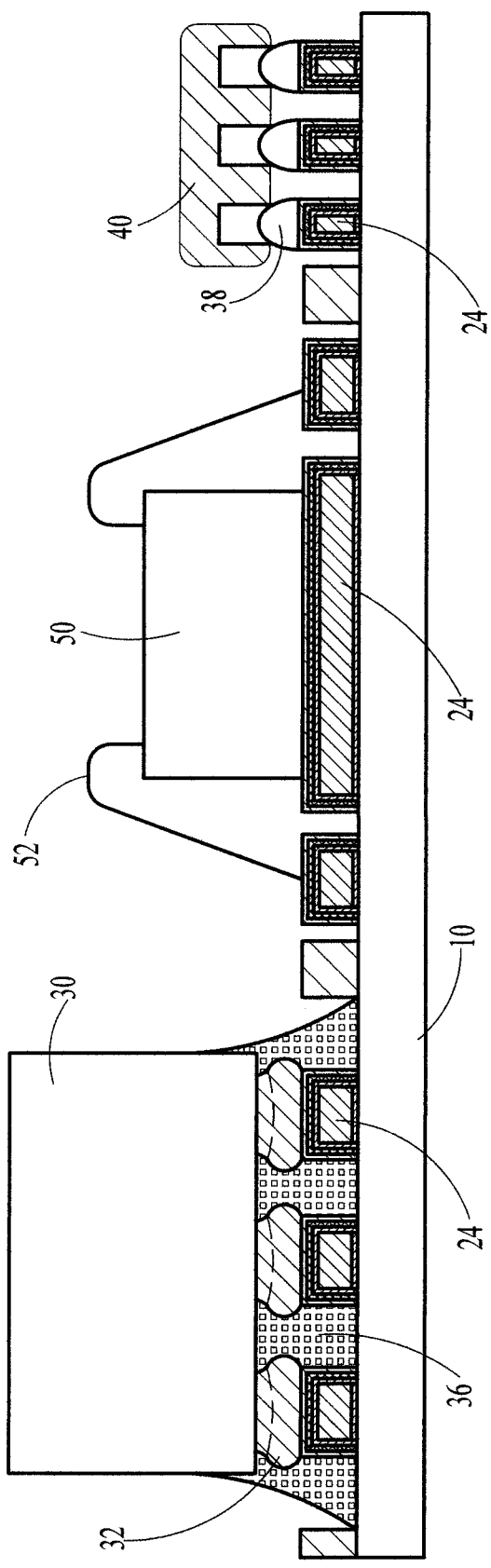

FIG. 6 illustrates an example of a system on flex package that includes at least one flip chip die 30 using a thermal compression bonding. Shown are gold bumps 32 with electrical connections 24 and capillary underfill 36 between the chip and the substrate 10. Die 50 is attached to a trace 24 and gold wirebonded 52 to other traces 24. Passive components 40 are mounted adjacent to the Chip/IC using surface mount technology. The surface finish on the traces 24 is optimized to have good diffusion bonding through gold bumps 32, flip-chip bonding, and soldering capabilities through solder bumps 38.

Any of the examples shown in FIGS. 1-6 and other examples not shown can be fabricated according to the process of the present disclosure.

A full additive process is disclosed which is expected to meet the future demands on fine line and space, targeting for flip chip assembly. This process can be achieved using the current reel to reel production capabilities. The inner lead bonding (ILB) pitch between traces will be between about 10 µm and 30 µm, and preferably less than about 15 µm, with a line width of about 7.5 µm and spacing of about 7.5 µm.

Referring now to FIGS. 7A-7E, a first preferred embodiment in the process of the present disclosure will be described in detail. The substrate 10 has at least one metal layer and can have one conductive metal layer or more than one conductive metal layer. Additionally, the flexible substrate 10 can have double-sided conductive metal layers or more than two stack-up conductive metal layers. The dielectric material in the flexible substrate may be polyimide (PI), liquid crystal polymer (LCP), Polyester (PET), polyethylene-naphthalate (PEN), cyclo-olefin polymer (COP), poly tetra fluoro ethylene, or a laminate substrate such as epoxies and BT, or Teflon or modified Teflon.

Figure 7A:
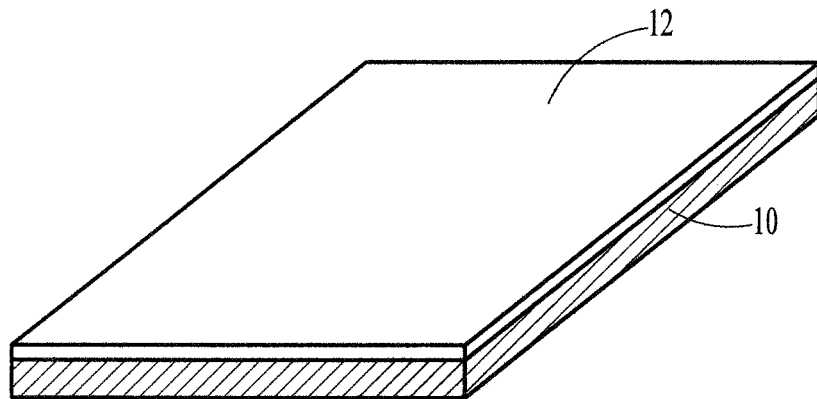
FIGS. 7A-7E schematically illustrate in cross-sectional representation steps in a first preferred embodiment process of the present disclosure.

As shown in FIG. 7A, a seed layer 12 of autocatalytic Nickel-Phosphorus (Ni—P) is applied on, for example, a polyimide tape substrate 10 to a thickness of between about 0.09 µm and 0.11 µm, and preferably about 0.1 µm, using an electroless plating process to catalytically activate the surface of the polyimide tape or any other dielectric surface. Preferably, the composition of Ni—P in the seed layer is Ni: 96.5-98.0 wt % and P: 2.0-3.5 wt %. In some other applications, the Ni—P elemental composition can be different and the thickness can be in the range of 0.08 µm and 0.15 µm, depending on the adhesion requirement. The adhesion strength of copper over the Ni—P seed layer has been found to be more than 8 N/cm.

Figure 7B:
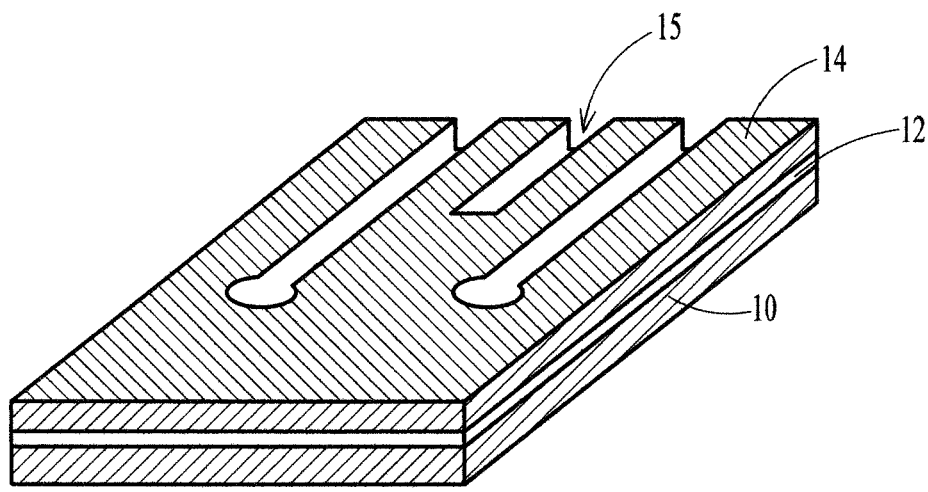

The Ni—P layer is annealed at between about 180 and 200° C. for a minimum of one hour, and for up to five or more hours, for promoting interfacial adhesion between polyimide and Ni—P. Ni—P is deposited using an electroless plating process to catalytically activate the surface of the dielectric. A photoresist coating 14, either a dry film or a liquid photoresist and preferably a positive-acting photoresist, is applied to the seed layer surface of the substrate. In a photolithography process, the photoresist is exposed and developed to form a fine pitch trace or pattern 15 for circuitization, as shown in FIG. 7B.

Figure 7C:
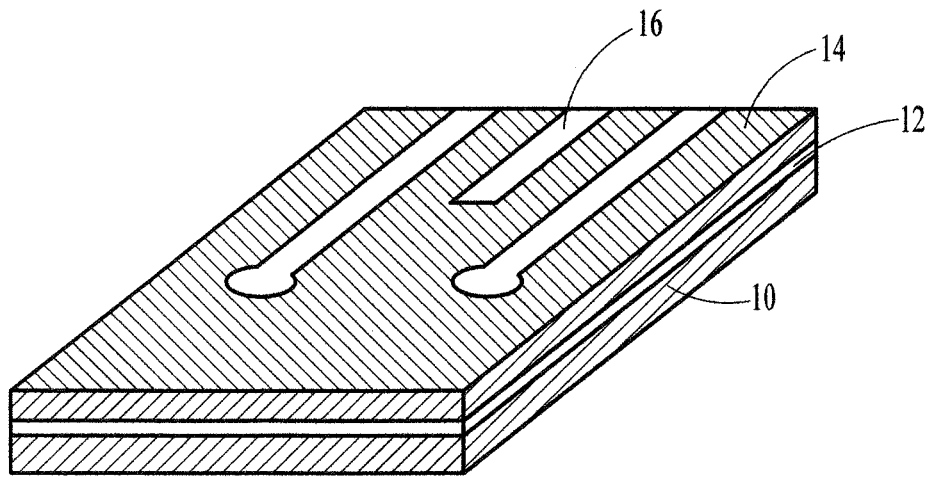
Figure 7D:
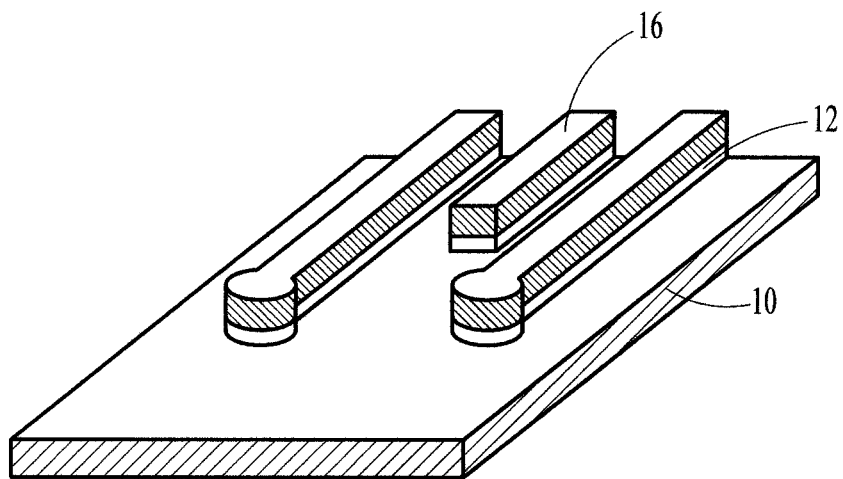

A layer of conductive metal 16 including a trace for active bonding and a pad for surface mounting are plated up to the desired thickness of about 6 µm using electrolytic copper plating, as shown in FIG. 7C. The copper is a fine-grained deposit with highly ductile properties. The elongation strength of the copper deposit is over 15% with a tensile strength of between about 290 and 340 N/mm$^2$. The hardness of the electrolytic copper should be about 100 HV (Vicker pyramid number) with a purity of more than 99.9%. In some applications, the thickness of copper can be in the range of 2-25 µm, and preferably about 8 µm. The plating is only employed on the areas of the spacing which are not covered by the photoresist. In some applications, the plating is controlled to be at an aspect ratio of more than 1. The top and bottom ratio of the trace using this method can be more than 1. The photoresist mask 14 is then stripped out followed by Ni—P seed layer etching away where it is not covered by the conductive metal layer, as shown in FIG. 7D.

Figure 7E:
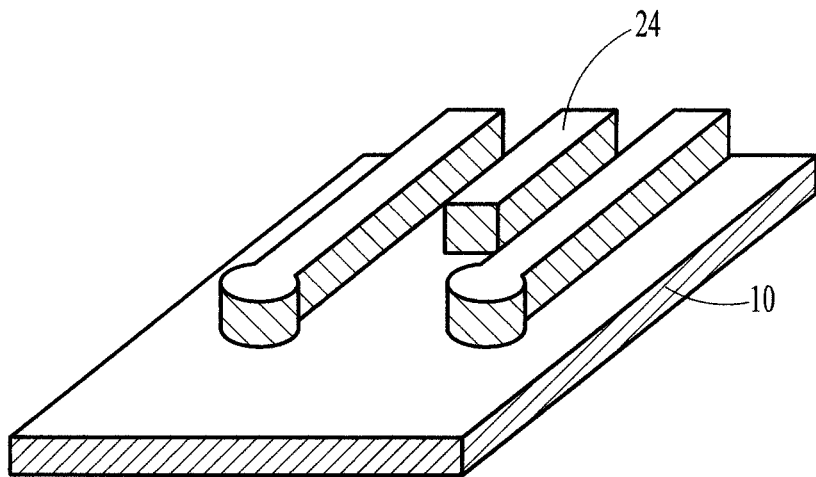

Referring to FIG. 7E, ENEPIG is employed as a surface finish 24 for the traces 16. As seen in more detail in cross-section in FIG. 9, in a departure from the prior art ENEPIG process, first a layer 18 of Ni—P is electrolessly plated onto top and side surfaces of the copper traces 16. Preferably, the Ni—P layer has a thickness of between 0.08 µm and 0.15 µm, and preferably about 0.1 µm for fine pitch circuitry. The Ni—P seed layer acts as an adhesion promoter and protects the copper trace against the ENEPIG process. The hardness of the nickel is approximately 500 HV. The nickel is more than 90% pure with 8-10% phosphorus. The pH value of the Ni—P solution should be maintained at between about 5.4 and 6.3. The electroless Ni—P deposit is amorphous and non-crystalline with a non-magnetic structure.

In an alternative IGEPIG process, a first gold layer 18 of 99.9% pure gold is coated on the copper layer by immersion plating to a thickness of between about 0.01 µm and 1.0 µm, and preferably about 0.06 µm. This thickness is preferred for solid state diffusion bonding for flip chip IC/chips interconnections. Additionally, the first gold layer 18 is a uniform fine-grained deposit with a hardness value of approximately 100 HV. The pH of the gold solution should be maintained at between about 7.5 and 9.5.

Next, a layer of autocatalytic palladium 20 is plated onto the Ni—P layer or first gold layer to a thickness of between about 0.05 μm and 1.0 μm, and preferably about 0.14 μm, in an electroless plating process. The hardness of the palladium will be in the range of between about 400 and 450 HV. The purity of palladium should be more than 98% with 1-2% phosphorus added. The pH value of the palladium solution should be maintained at between about 4.5 and 6.5.

Finally, a gold layer of 99.9% pure gold 22 is coated on the palladium layer by immersion plating to a thickness of between about 0.05 μm and 1.0 μm, and preferably about 0.2 μm. This thickness is preferred for solid state diffusion bonding for flip chip IC/chips interconnections. Additionally, the gold layer 22 is a uniform fine-grained deposit with a hardness value of approximately 100 HV. The pH of the gold solution should be maintained at between about 7.5 to 9.5.

The resulting traces 24 comprise five different conductive materials having different melting points and plastic deformation properties, which are optimized, as detailed above, to compensate for both diffusion bonding and soldering of passive components. Although there are two Ni—P layers in the ENEPIG process, the two layers have different compositions and thus, different melting points and plastic deformation properties, so are considered to be of two different materials. In the alternative IGEPIG process, there are four different conductive materials having different melting points and plastic deformation properties, which are optimized, as detailed above, to compensate for both diffusion bonding and soldering of passive components, arranged in five layers, including two gold layers.

Figure 9:
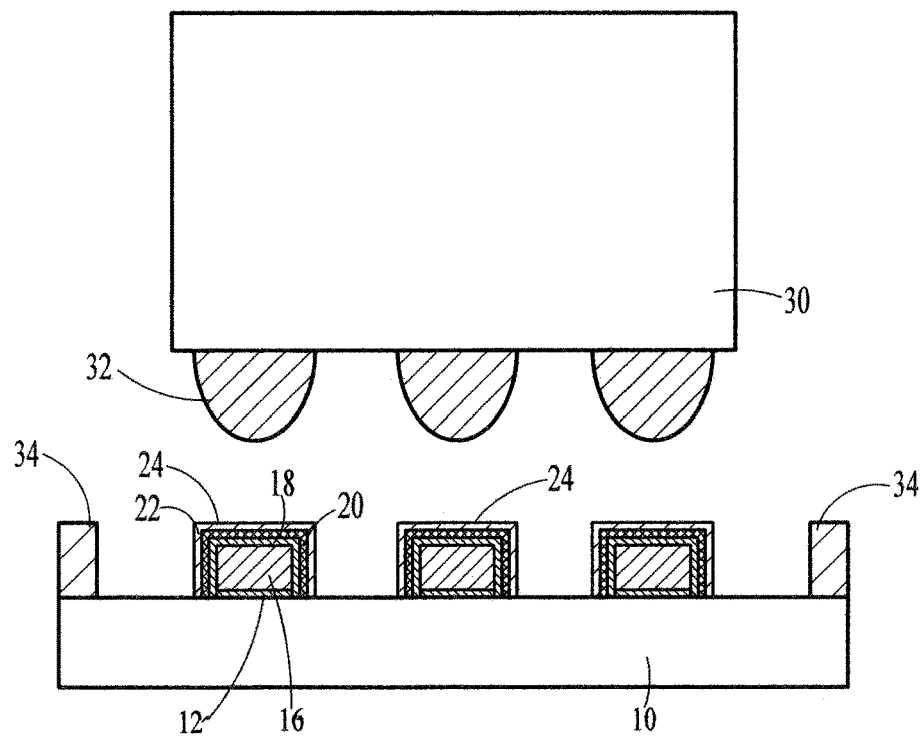
FIGS. 9-11 schematically illustrate in cross-sectional representation bonding steps following the first or the second embodiment of the present disclosure.

FIG. 9 also illustrates die 30 having gold bumps 32 formed on an underside thereof. A solder mask 34 is formed after the ENEPIG or IGEPIG process by a conventional screen printing. Alternatively, the solder mask can be selectively applied before the ENEPIG or IGEPIG process. Gold bumps 32 are conventional gold plated or gold stud bumps.

Figure 10:
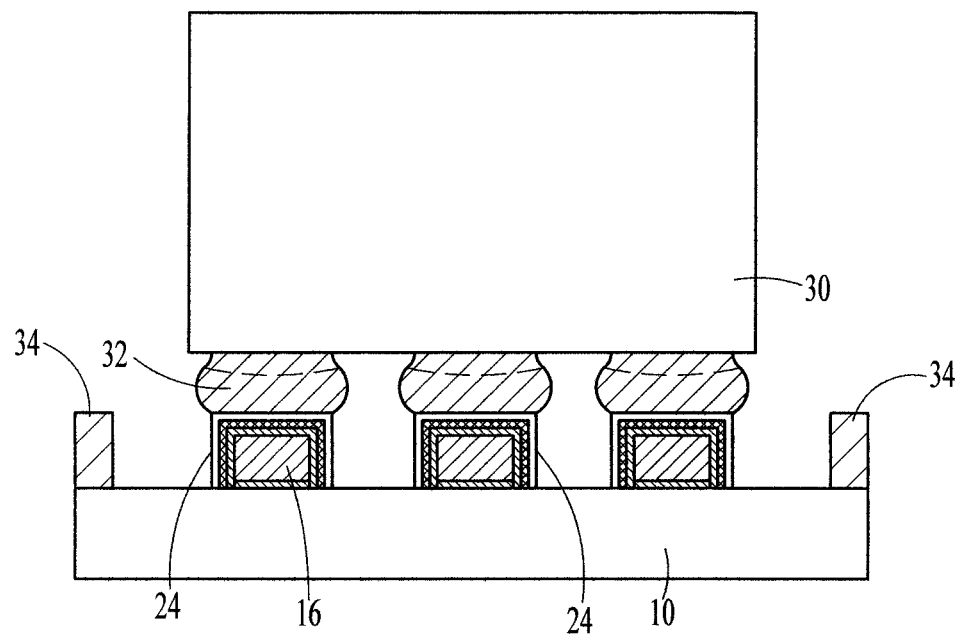

Now, a flip chip bonding of the die 30 to the trace 24 of the packaging substrate is performed using a thermal compression bonding, as shown in FIG. 10. The bond is subjected to a bonding temperature of between about 280 and 300° C. at the interface with a constant pressure of about 163 MPa. The higher bonding temperature in the range improves the bond strength of the gold bump to the substrate pad.

Figure 11:
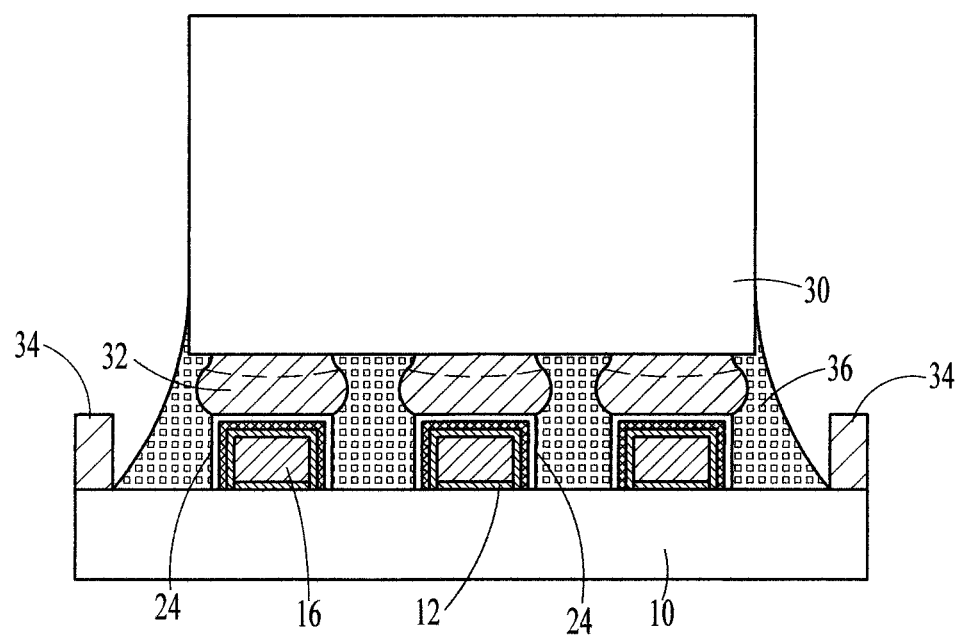

Next, as shown in FIG. 11, a capillary underfill 36 is applied after thermal compression bonding which protects the electrical connections between the chip 30 and the substrate 10 from moisture, ionic contaminants, radiation, and hostile operating environments, and compensates for differences in thermal expansion rates between the gold bump 32 and flex substrate 10 to increase the life expectancy of the finished product. The underfill may be dispensed on one or more sides of the flip chip dies, sometimes in multiple dispense passes to allow for capillary action.

A second preferred embodiment of the process of the present disclosure is described with reference to FIGS. 8A-8F. The second preferred embodiment is a semi-additive process with a seed layer of copper on top of an underlayer. For this semi-additive process, various alternatives exist for the underlayer including a Nickel/Chromium or Chromium alone tie coat layer for a sputtering-type substrate, or thermoplastic polyimide (TPI) for an adhesive-less/casting type substrate, or an epoxy/acrylic base adhesive layer for a lamination-type substrate. The semi-additive process is not targeted for finer bond pitch, due to the under-cut concern which might cause weakened trace adhesion. This process would be preferred for a larger bond pitch.

Figure 8A:
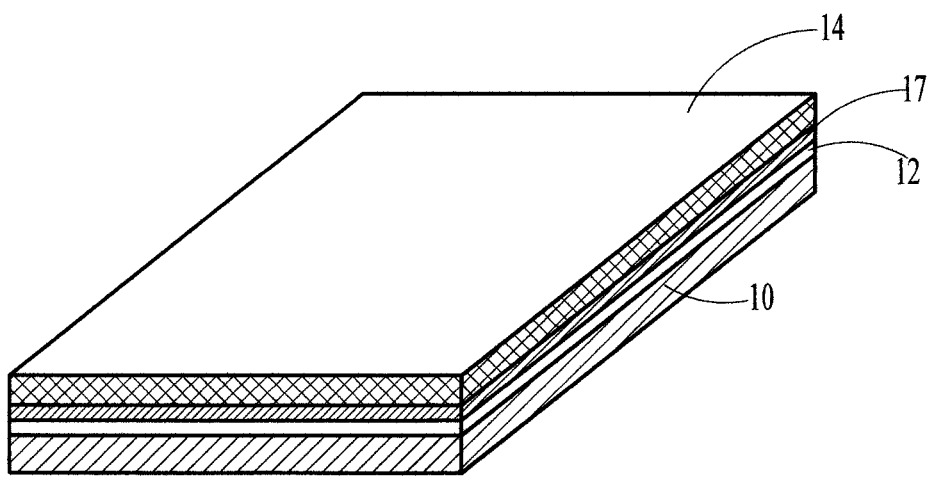
FIGS. 8A-8F schematically illustrate in cross-sectional representation steps in a second preferred embodiment process of the present disclosure.

The flexible substrate 10 is as described in the first embodiment. As shown in FIG. 8A, a seed layer 12 Nickel/Chromium or Chromium alone tie coat layer is deposited on a sputtering-type substrate, or thermoplastic polyimide (TPI) is deposited on an adhesive-less/casting type substrate, or an epoxy/acrylic base adhesive layer is deposited on a lamination-type substrate 10 to a thickness of between about 0.08 μm and 0.15 μm, and preferably about 0.1 μm, using an electroless plating process.

Next, a layer of copper 17 is plated to a thickness of about 2 μm on the seed layer. The Cu and seed layers are annealed at between about 180 and 200° C. for a minimum of one hour and up to five or more hours for promoting interfacial adhesion between the substrate and the seed layer.

Figure 8B:
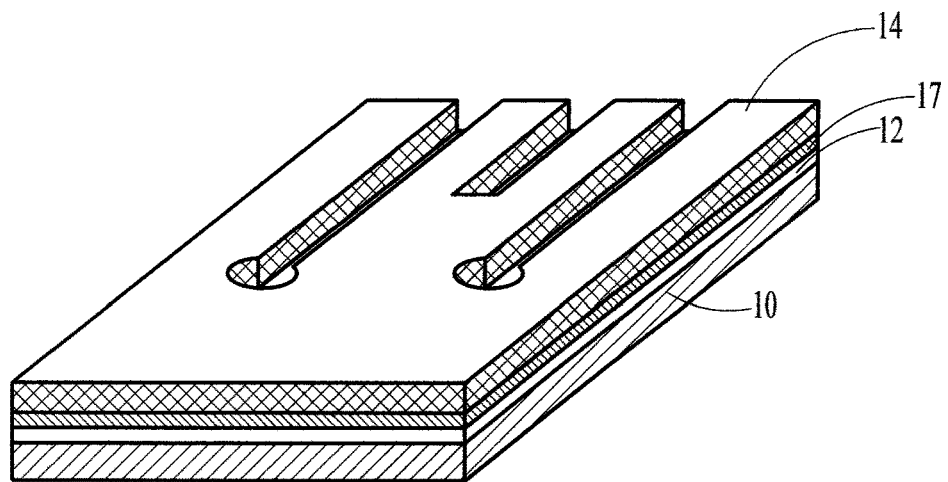

A photoresist coating, either a dry film or a liquid photoresist and preferably a positive-acting photoresist, is applied to the copper layer surface 17 of the substrate. In a photolithography process, the photoresist is exposed and developed to form a fine pitch trace or pattern 14 for circuitization, as shown in FIG. 8B.

Figure 8C:
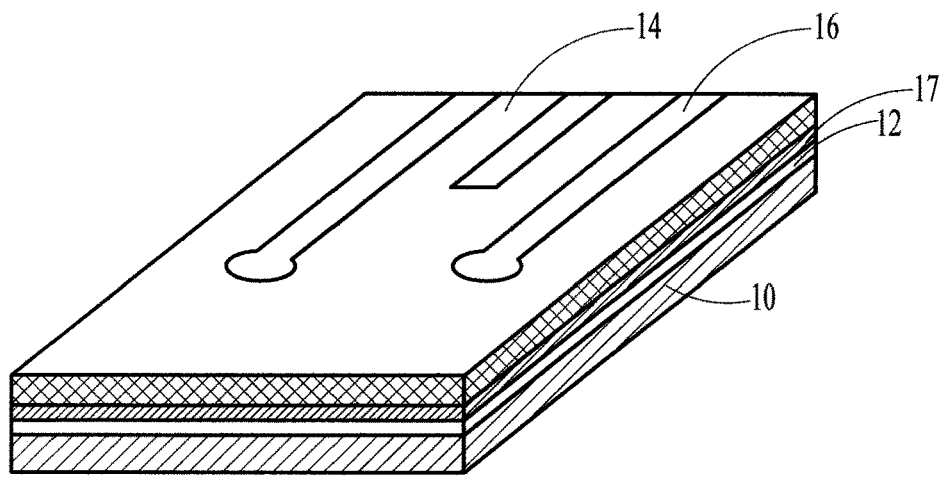

Additional copper 16 including a trace for active bonding and a pad for surface mounting is plated up on the first copper layer 17 to the desired thickness of about 8 μm using electrolytic copper plating, as shown in FIG. 8C. In some applications, the thickness of copper can be in the range of 2-25 μm.

Figure 8D:
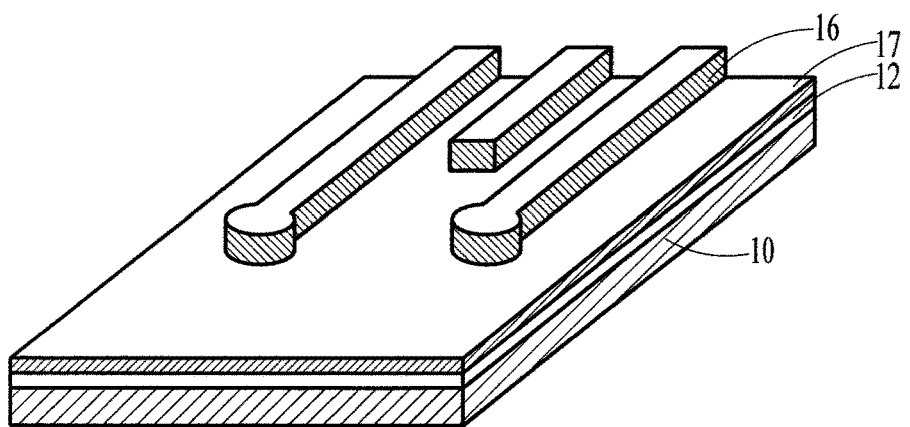
Figure 8E:
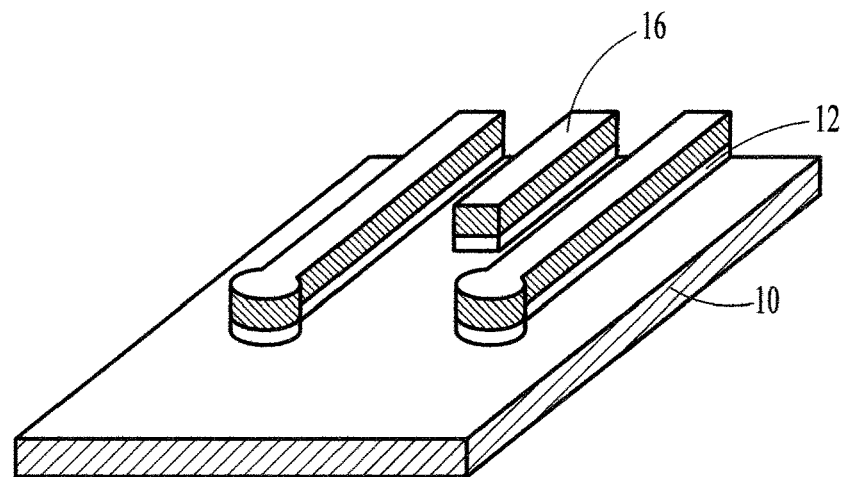
Figure 8F:
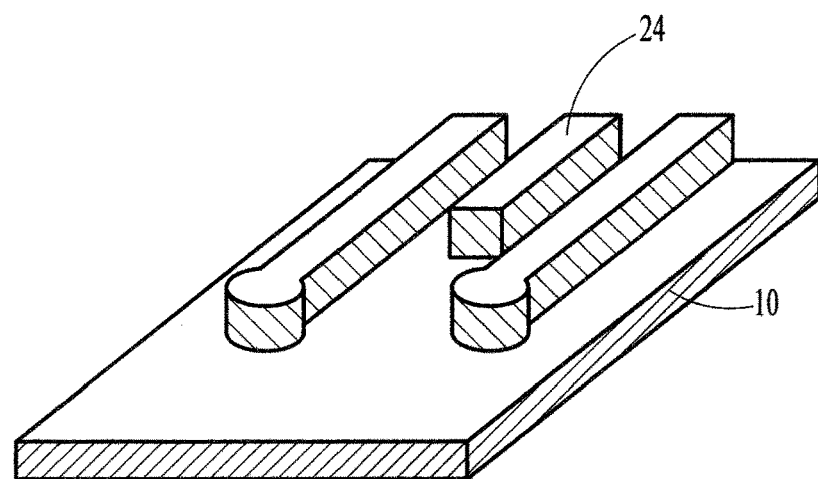

Now, the photoresist mask 14 is stripped away as shown in FIG. 8D. The copper 17 and seed layer 12 are etched away, as shown in FIG. 8E. Referring to FIG. 8F, the revised ENEPIG or IGEPIG is employed as a surface finish 24 for the traces 16, as described above in the first embodiment.

In another alternative embodiment, instead of the revised ENEPIG or IGEPIG coating on the traces, Ni and then Au layers can be electrolytically plated on the copper traces. This alternative can be used in either the full additive or semi-additive processes. However, the Ni/Au coating is not preferred for fine pitch traces.

Figure 12:
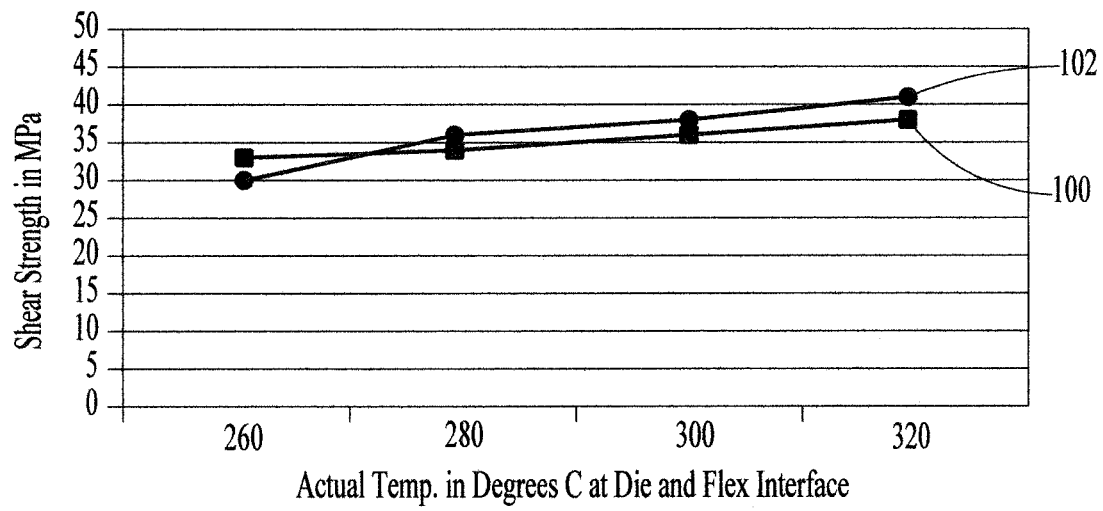
FIG. 12 graphically illustrates a shear strength comparison at constant time and constant force.

FIG. 12 graphically illustrates a shear strength comparison at constant time and constant force. The shear strength in MPa (Megapascals=Newtons per square millimeter) as a function of temperature in degrees Celsius of the thermal compressive bond through a gold bump between the die and the trace is compared for a Ni/Au coating on a copper trace 100 and the revised ENEPIG coating of the present disclosure (Ni—P/Pd/Au) on a copper trace with underlying Ni—P seed layer 102. In the process of the present disclosure, as shown by line 102, shear strength increases with the increase in bonding pressure.

Figure 13:
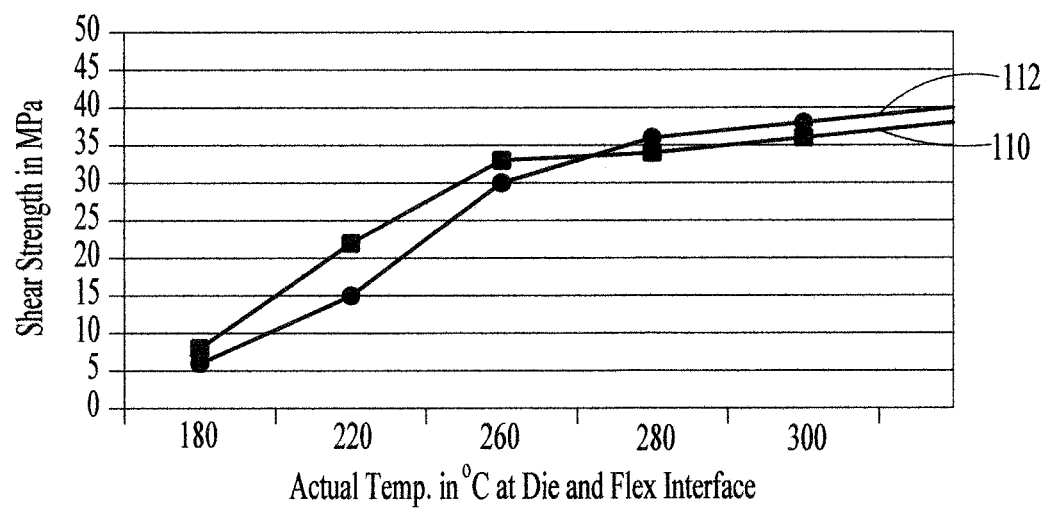
FIG. 13 graphically illustrates a shear strength comparison at constant bonding pressure and time.

FIG. 13 graphically illustrates a shear strength comparison at constant bonding pressure and time. The shear strength in MPa as a function of the actual bonding temperature at the die and substrate interface of the thermal compressive bond is compared for a Ni/Au coating on a copper trace 110 and the ENEPIG coating of the present disclosure (Ni—P/Pd/Au) on a copper trace with underlying Ni—P seed layer 112. It can be seen that shear strength increases with the increase in bonding temperature for both samples. The shear strength of the sample with the full additive trace with revised ENEPIG coating of the present disclosure (line 112) has increased with higher bonding temperature as compared to the sample with Ni/Au coating (line 110).

Figure 14:
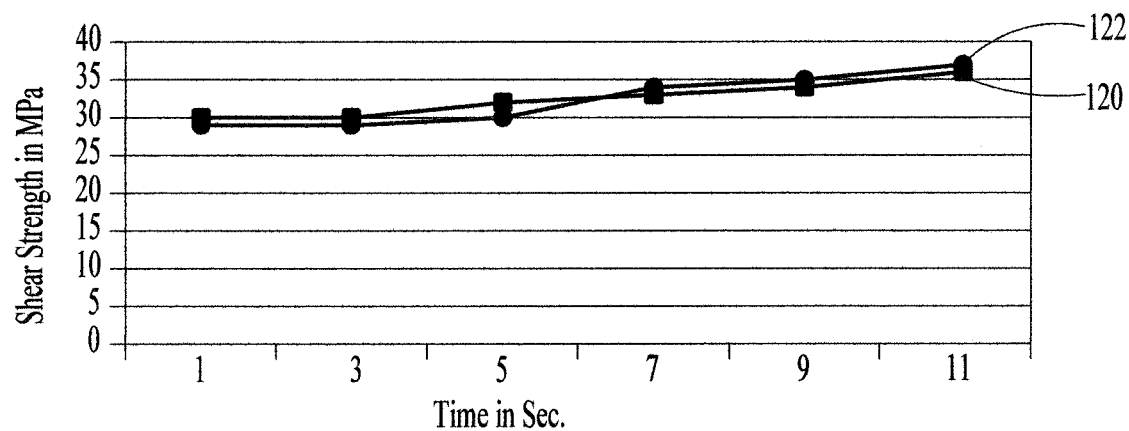
FIG. 14 graphically illustrates a shear strength comparison at constant bonding pressure and temperature.

FIG. 14 graphically illustrates a shear strength comparison at constant bonding pressure of 163 MPa and temperature of 300° C. The shear strength in MPa as a function of the bonding time in seconds of the thermal compressive bond through a gold bump between the die and the trace is compared for a Ni/Au coating on a copper trace 120 and the ENEPIG coating of the present disclosure (Ni—P/Pd/Au) on a copper trace with underlying Ni—P seed layer 122. It can be seen that shear strength slightly increases with the increase in bonding time. A similar bonding time for a solid diffusion bond is required for both samples.

Figure 15:
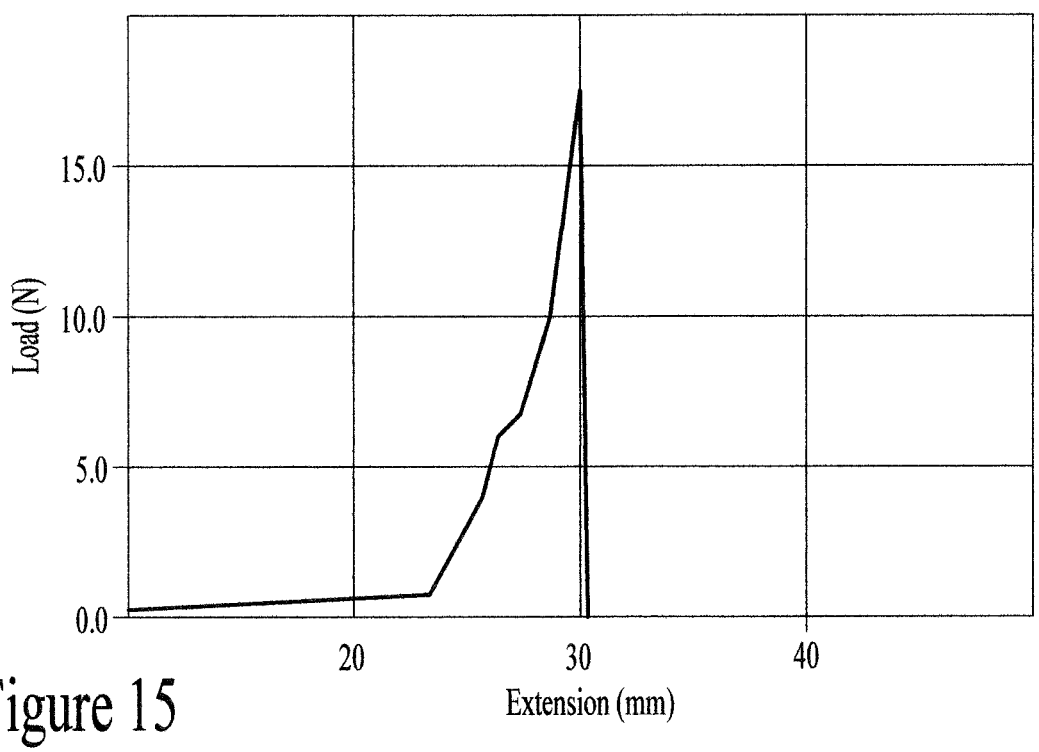
FIG. 15 graphically illustrates the interfacial bond strength of the first embodiment of the present disclosure.

A pull test was performed on a die bonded to a substrate using the full additive thermal bonding process with revised ENEPIG of the first embodiment, bonded at 340° C. A rod was attached to the upper side of the die using underfill material. The rod was pulled until the bond holding the die to the substrate was broken. The strength of the bond was measured at more than 15 MPa, as shown in FIG. 15.

The diffusion bonding process of the present disclosure can be used in smart phone devices, tablets, laptops, UHD TV, Desktop PC, Game station, setup box, servers, Cars, ultrasonics handler, and medical device and CT scanner. Furthermore, the disclosed process can be incorporated into a communications device, a fixed location data unit, a wearable electronic device, a display driver, an integrated touch and display driver (TDDI), an AMOLED display, a micro LED display, a CMOS image sensor, a baseband processor, a power management unit, a memory, CPU, GPU, ASIC, LED, RF, and for applications in mobile/wireless, consumer, computing, medical, industrial, and automotive technologies.

The diffusion bonding process of the present disclosure using the five layer ENEPIG or IGEPIG coated copper trace provides superior thermo-compression bonding of dies, especially in flip-chip processes. Using this process, the minimum die-to-die gap can be below 10 µm with a flip chip bonding accuracy of +/−2 µm. The process can produce fine pitch circuits down to 16 µm pitch and below because of the Ni—P seed layer. With the full additive process, the top and bottom trace aspect ratio can be more than 1. The improved solid Au—Au diffusion bonding is of great value in future personal electronics devices. The selection criteria of the disclosed trace construction such as plastic deformation, thermal conductivity, thermal expansion, and bonding environment are ideally suitable for the diffusion bonding process, particularly for high density interconnects.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of manufacturing a semiconductor package comprising:
    providing a flexible substrate;
    forming a plurality of traces on said flexible substrate, said forming comprising:
        electrolytically plating copper traces on said flexible substrate, said copper traces having a pitch of between about 15 µm and 30 µm;
        immersion plating a first gold layer on top and side surfaces of said plurality of copper traces;
        electroless plating a palladium layer on said nickel-phosphorus layer; and
        immersion plating a second gold layer on said palladium layer;
    forming a gold bump on a die surface; and
    diffusion bonding said die to at least one of said plurality of traces by thermal compression of said gold bump to complete said semiconductor package.

2. The method according to claim 1 wherein said copper has a purity of more than 99.9% and a hardness of about 100 HV and is plated to a thickness of between about 2 µm and 25 µm, and preferably about 8 µm.

3. The method according to claim 1 wherein a pH of a gold solution used in said immersion plating said first gold layer is maintained at between about 7.5 and 9.5 and wherein said first gold layer comprises about 99.9% pure gold, having a hardness of about 100 HV, and a thickness of between about 0.01 µm and 1.0 µm, and preferably about 0.06 µm.

4. The method according to claim 1 wherein a pH value of a palladium solution used in said electroless plating is maintained at between about 4.5 and 6.5 and wherein said palladium layer has a purity of more than 98% with 1-2% phosphorus added, a hardness of between about 400 and 450 HV, and a thickness of between about 0.05 µm and 1.0 µm, and preferably about 0.14 µm.

5. The method according to claim 1 wherein a pH of a gold solution used in said immersion plating of said second gold layer is maintained at between about 7.5 and 9.5 and wherein said second gold layer comprises about 99.9% pure gold, having a hardness of about 100 HV, and a thickness of between about 0.05 µm and 1.0 µm, and preferably about 0.2 µm.

6. The method according to claim 1 further comprising forming a Ni—P seed layer underlying said copper traces, wherein said Ni—P seed layer is formed in an electroless plating process, wherein a composition of said Ni—P layer is Ni: 96.5 to 98.0 wt % and P: 2.0-3.5 wt % and wherein a thickness of said Ni—P seed layer is between about 0.08 µm and 0.15 µm, and preferably about 0.1 µm.

7. The method according to claim 6, further comprising annealing said Ni—P seed layer at between about 180 and 200° C. for between 1 and 5 hours to improve the bond strength of said plurality of traces.

8. The method according to claim 6 further comprising:
    forming a resist pattern on said Ni—P seed layer;
    plating said copper traces on said Ni—P seed layer not covered by said resist;
    thereafter stripping said resist; and
    thereafter etching away said Ni—P seed layer not underlying said copper traces.

9. The method according to claim 8, wherein said resist pattern is formed from a patterned dry film resist or liquid photoresist.

10. The method according to claim 1, further comprising forming a seed layer underlying said copper traces, wherein said seed layer comprises a Nickel/Chromium or Chromium tie coat layer on a sputtering-type substrate or thermoplastic polyimide (TPI) on an adhesive-less/casting type substrate or an epoxy/acrylic base adhesive layer on a lamination-type substrate.

11. The method according to claim 7 further comprising:
    plating a first copper layer on said seed layer;
    forming a resist pattern on said first copper layer;
    plating said copper traces on said first copper layer not covered by said resist;
    thereafter stripping said resist pattern;
    etching away said first copper layer not covered by said copper traces; and
    thereafter etching away said seed layer not underlying said copper traces.

12. The method according to claim 1 further comprising mounting at least one passive component on another of said plurality of traces by a solder bump.

13. The method according to claim 1 further comprising applying capillary underfill between said at least one die and said substrate.

14. The method according to claim 1 further comprising:
mounting at least one second die onto said substrate wherein there is a diffusion bond between another one of said at least one of said plurality of traces and at least one second gold bump on said at least one die wherein said at least one die and said at least one second die are less than about 10 µm apart.

15. The method according to claim 14 further comprising applying capillary underfill between said at least one die and said at least one second die and said substrate.

16. The method according to claim 1 further comprising:
folding said flexible substrate around a stiffener wherein said at least one die is over a top surface of said stiffener; and
attaching at least one solder ball to another one of said plurality of traces over a bottom surface of said stiffener.

17. A method of manufacturing a semiconductor package comprising:
providing a flexible substrate;
forming a plurality of traces on said flexible substrate, each respective trace comprising at least four different conductive materials having different melting points and plastic deformation properties constructed in five layers, which are optimized for both diffusion bonding and soldering of passive components wherein a topmost layer of each said trace comprises gold;
mounting at least one first die on said substrate wherein there is a diffusion bond between at least one of said plurality of traces and a gold bump on said at least one first die;
die attaching at least one second die on a second of said plurality of traces and forming wire bonds between said at least one second die and at least a third of said plurality of traces; and
mounting at least one passive component on a fourth of said plurality of traces by a solder bump.

18. The method according to claim 17, wherein said topmost layer of each said trace comprises gold having a purity of about 99.9%, a hardness of about 100 HV, and a thickness of between about 0.05 µm and 1.0 µm, wherein a second layer of each of said traces next closest to said diffusion bond comprises palladium, having a purity of 99.9%, a hardness of between about 250 and 450 HV, and a thickness of between about 0.05 µm and 1.0 µm, wherein a third layer of each of said traces comprises gold having a purity of about 99.9%, a hardness of about 100 HV, and a thickness of between about 0.01 µm and 1.0 µm, wherein a fourth layer of each of said traces comprises copper having a purity of more than 99.9%, a hardness of about 100 HV, and a thickness of between about 2 µm and 25 µm, and wherein an underlying layer of each of said traces on said substrate comprises nickel-phosphorus having a thickness of between about 0.08 µm and 0.15 µm.

19. A method of manufacturing a semiconductor package comprising:
providing a flexible substrate;
forming a plurality of traces on said flexible substrate, each respective trace comprising at least four different conductive materials having different melting points and plastic deformation properties constructed in five layers, which are optimized for both diffusion bonding and soldering of passive components wherein a topmost layer of each said trace comprises gold;
mounting at least one die on said flexible substrate wherein there is a diffusion bond between at least one of said plurality of traces and a gold bump on said at least one die;
folding said flexible substrate around a stiffener wherein said at least one die is over a top surface of said stiffener; and
attaching at least one solder ball to another one of said plurality of traces over a bottom surface of said stiffener.

20. The method according to claim 19, wherein said topmost layer of each said trace comprises gold having a purity of about 99.9%, a hardness of about 100 HV, and a thickness of between about 0.05 µm and 1.0 µm, wherein a second layer of each of said traces next closest to said diffusion bond comprises palladium, having a purity of 99.9%, a hardness of between about 250 and 450 HV, and a thickness of between about 0.05 µm and 1.0 µm, wherein a third layer of each of said traces comprises gold having a purity of about 99.9%, a hardness of about 100 HV, and a thickness of between about 0.01 µm and 1.0 µm, wherein a fourth layer of each of said traces comprises copper having a purity of more than 99.9%, a hardness of about 100 HV, and a thickness of between about 2 µm and 25 µm, and wherein an underlying layer of each of said traces on said substrate comprises nickel-phosphorus having a thickness of between about 0.08 µm and 0.15 µm.

\* \* \* \* \*